United States Patent [19]
Pfiester et al.

[11] Patent Number: 5,241,193
[45] Date of Patent: Aug. 31, 1993

[54] SEMICONDUCTOR DEVICE HAVING A THIN-FILM TRANSISTOR AND PROCESS

[75] Inventors: James R. Pfiester; James D. Hayden, both of Austin, Tex.

[73] Assignee: Motorola, Inc., Schaumburg, Ill.

[21] Appl. No.: 885,332

[22] Filed: May 19, 1992

[51] Int. Cl.$^5$ ............... H01L 27/01; H01L 24/469
[52] U.S. Cl. .................... 257/67; 257/316; 257/368; 257/401; 257/900; 437/106; 437/233; 437/234; 437/235
[58] Field of Search ............ 357/23.7, 23.14; 257/67, 316, 368, 401, 900; 437/106, 233, 234, 235

[56] References Cited

U.S. PATENT DOCUMENTS

| | | | |
|---|---|---|---|
| 4,603,468 | 8/1986 | Lam | 357/23.7 |
| 4,633,284 | 12/1986 | Hansell et al. | 357/23.7 |
| 4,980,732 | 12/1990 | Okazawa | 357/23.5 |
| 5,083,190 | 1/1992 | Pfiester | 357/23.14 |
| 5,100,816 | 3/1992 | Rodder | 357/23.7 |

Primary Examiner—Edward Wojciechowicz
Attorney, Agent, or Firm—Jasper W. Dockrey

[57] ABSTRACT

A semiconductor device having a thin-film transistor (22) and a process for making the device. The semiconductor device includes a substrate (11) having a principal surface. A gate electrode (29) overlies the principal surface and a gate dielectric layer (23) overlies the gate electrode (29). A conductive channel interface layer (25) overlies the upper surface of the gate electrode (29) and is spaced apart from the gate electrode (29) by the gate dielectric layer (23). A conductive thin-film layer (57) overlies the gate electrode (29) and forms a metallurgical contact to the channel interface layer (25). Remaining portions of the thin-film overlie the principal surface and form source and drain regions (63, 65) of the thin-film transistor (22). The thin-film source and drain regions (63, 65) are formed by placing a diffusion barrier cap (60) over the channel portion (61) of the thin-film layer (57) and introducing conductivity determining dopant into the thin-film layer (57). A silicide is formed in the thin-film source and drain regions (63, 65) by the depositing a refractory metal layer over the thin-film layer (57) and the diffusion barrier cap (60) and annealing the thin-film layer (57).

17 Claims, 3 Drawing Sheets

SEMICONDUCTOR DEVICE HAVING A THIN-FILM TRANSISTOR AND PROCESS

RELATED APPLICATION

Related subject matter is disclosed in commonly assigned, co-pending patent application filed on even date. Related subject matter is also disclosed in commonly assigned, co-pending patent application Ser. No. 07/797,580 filed on Nov. 25, 1991.

FIELD OF THE INVENTION

This invention relates in general to semiconductor devices, and more particularly to shared-gate CMOS devices having thin-film transistors.

BACKGROUND OF THE INVENTION

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory device (DRAM) or static-random-access-memory device (SRAM), the components must be arranged compactly if the overall device dimensions are not to become excessively large. This problem is especially critical in SRAM devices where a typical individual memory cell contains as many as six separate components.

One important technique for fabricating a device having a small surface area is to stack MOS transistors in a vertical arrangement. Typically, a first transistor is formed in the substrate having source, drain, and channel regions in the substrate and a gate electrode overlying the substrate surface. Then, a second transistor is formed in a thin-film layer overlying the first transistor. By adding an additional electrical component to the device, the thin-film transistor increases the functional capacity of a device while not consuming additional surface area.

Thin-thin transistors are especially useful in CMOS logic devices. For example, a CMOS inverter can be fabricated from an N-channel transistor in the substrate and P-channel, pull-up transistor in a thin-film layer overlying the N-channel transistor.

While thin-film transistors remain a useful design alternative for the formation of compact devices, they usually exhibit poor performance. Thin-film transistors are most often formed in an amorphous or polycrystalline material which does not conduct charge as well as a single crystal substrate. In addition, the fabrication process may result in contamination of the gate dielectric layer between the thin-film channel and the gate electrode. Contamination of the gate dielectric further impairs performance by causing flat-band voltage shifting.

Thin-film transistors also increase the topographic contrast of an integrated circuit device. Because thin-film transistors require an additional layer which must be formed over existing structures on the substrate surface, the total vertical height of the device above the substrate surface is increased. When metal leads are formed to interconnect the device with external portions of the integrated circuit, step coverage problems are encountered as the metal leads traverse the steep topography of the device. The severe topography can cause voids to develop in the leads resulting in loss of electrical conduction and device failure. Therefore, further development of thin-film transistors is necessary to meet the needs of high density semiconductor devices.

BRIEF SUMMARY OF THE INVENTION

In practicing the present invention there is provided a semiconductor device having a thin-film transistor and a process for making the device. The semiconductor device includes a substrate having a principal surface. A gate electrode overlies the principal surface and a gate dielectric layer overlies the gate electrode. A conductive channel interface layer overlies the upper surface of the gate electrode and is spaced apart from the gate electrode by the gate dielectric layer. A conductive thin-film layer overlies the gate electrode and forms a metallurgical contact to the channel interface layer. Remaining portions of the thin-film overlie the principal surface and form source and drain regions of the thin-film transistor. The thin-film source and drain regions are formed by placing a diffusion barrier cap over the channel portion of the thin-film layer and introducing conductivity determining dopant into the thin-film layer. A silicide is formed in the thin-film source and drain regions by the depositing a refractory metal layer over the thin-film layer and the diffusion barrier cap and annealing the thin-film layer.

Figure 1:
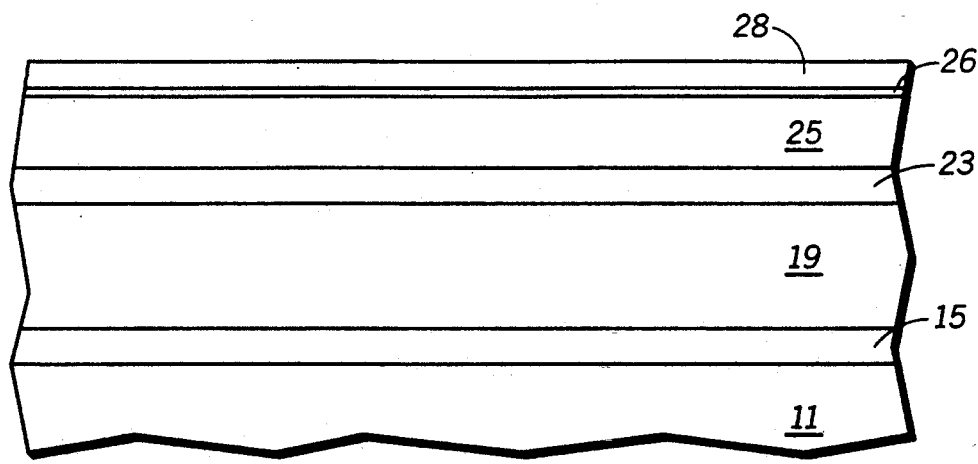
FIGS. 1-7, illustrate, in cross-section, process steps in accordance with the invention.

It will be appreciated that for simplicity and clarity of illustration elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

The thin-film device made in accordance with the invention is applicable to a wide range of integrated circuit devices and is especially applicable to an SRAM device made using MOS technology. It will be appreciated, however, that the thin-film device made in accordance with the invention is applicable to other devices and other technologies. It will be further appreciated that for the purposes of illustrating the invention, the conductive materials therein are described having a specified conductivity type. However, those skilled in the art will recognize that conductive materials having an opposite conductivity type are equally applicable.

Shown in FIG. 1 is a semiconductor substrate 11 having already undergone several process steps in accordance with the invention. A first gate dielectric layer 15 overlies substrate 11 and a first conductive layer 19 overlies dielectric layer 15. First gate dielectric layer 15 is preferably formed by thermally oxidizing substrate 11 to form an oxide layer overlying substrate 11.

Preferably, first conductive layer 19 is a polysilicon-refractory metal silicide composition (polycide) and is formed in a three step deposition sequence. In the first step, a portion of layer 19 is deposited to form a first layer of conductive material on substrate 11. A photolithographic pattern is formed and boron is ion implanted into substrate 11 using the photolithographic pattern as a doping mask. The boron implant (not shown) will adjust the threshold voltage of the MOS transistor which is to be constructed on substrate 11. A mask in formed over the polysilicon layer deposited in the first step of the formation of first conductive layer 19 and a phosphorus or arsenic implantation is performed through the polysilicon and first dielectric layer 15.

After the boron implantation, the photolithographic pattern is removed and a second layer of polysilicon is deposited. The first and second polysilicon layers are selectively doped with phosphorus using a thermal doping process. Alternatively, first and second polysilicon layers can be doped with phosphorus or arsenic using ion implantation. The selective doping process produces a sheet resistance of about 20 to 250 ohms per square.

After the thermal doping process is complete, a refractory metal silicide layer is deposited onto the second polysilicon layer. Preferably the refractory metal silicide is sputter deposited onto the second polysilicon layer, however, other deposition methods such as chemical vapor deposition and the like can be used. The formation of first conductive layer 19 is completed by a subsequent annealing process to form a silicided polysilicon layer. Preferably, the refractory metal is tungsten. However, other refractory metal silicides can be used such as silicides of cobalt, titanium, and molybdenum and the like. In an alternative method, the silicidation process is omitted and first conductive layer 19 is processed as a polysilicon layer.

Once first conductive layer 19 is formed, a second gate dielectric layer 23 is formed to overlie first conductive layer 19, as shown in FIG. 1. Preferably second dielectric layer 23 is formed by thermal oxidation of first conductive layer 19. Alternatively, second gate dielectric layer 23 can be a deposited layer formed by chemical vapor deposition. In one deposition method, silicon dioxide is chemical vapor deposited using tetraethylorthosilane (TEOS). Preferably, second dielectric layer 23 is deposited to a thickness of 5 to 20 nanometers.

After depositing second gate dielectric layer 23 channel interface layer 25 is deposited onto second gate dielectric layer 23. Preferably, channel interface layer 25 is polysilicon chemical vapor deposited to a thickness of about 25 to 50 nanometers. Alternatively, channel interface layer 25 can be an alloy of polysilicon and a silicon-germanium compound (SiGe). The alloy is formed by low pressure chemical vapor deposition using silane and germanium containing gases.

Next, a protective layer 26 can be formed by thermally oxidizing overlying channel interface layer 25. Protective layer 26 provides a means of preventing damage to channel interface layer 25 during subsequent processing. The formation of protective layer 26 is an optional process step which can be omitted depending on the selectivity characteristics of the etch processes used in the fabrication sequence.

After forming channel interface layer 25 and protective layer 26, a oxidation barrier layer 28 is deposited onto protective layer 26. Preferably, oxidation barrier layer 28 is silicon nitride chemical vapor deposited to a thickness of about 25 to 100 nanometers. Alternatively, oxidation barrier layer 28 can be an oxynitride layer.

Figure 2:
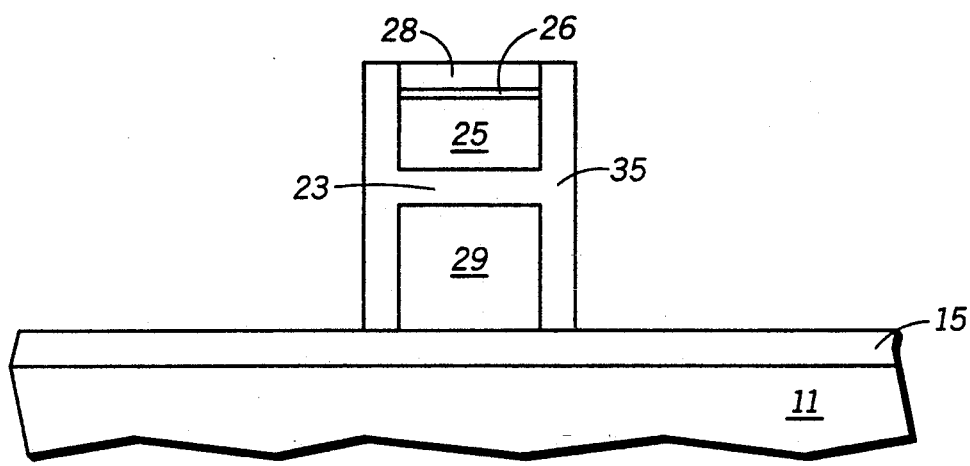

Once first conductive layer 19 and channel interface layer 25 are in place and interleaved by dielectric and protective layers, the composite structure is photolithographically patterned and anisotropically etched to form a shared-gate electrode 29, as illustrated in FIG. 2. In a preferred embodiment, a sequential anisotropic etch process is used to form shared-gate electrode 29. First, oxidation barrier layer 28 is etched exposing protective layer 26. Next, protective layer 26 is etched exposing channel interface layer 25. Then, channel interface layer 25 is etched exposing second gate dielectric layer 23. Then, second gate dielectric layer 23 is etched exposing first conductive layer 19. Finally, first conductive layer 19 is etched exposing first dielectric layer 15. After removing the photolithographic pattern, an oxidation step is carried out to form an oxide encapsulation layer 35 overlying shared-gate electrode 29. The shared-gate structure then appears as illustrated in FIG. 2.

The inventive shared-gate fabrication sequence described above has an important advantage for the formation of a thin-film transistor. During the etching process used to form shared-gate electrode 29, channel interface layer 25 protects second gate dielectric layer 23 from direct contact with photoresist and the plasma gases used in the etch process. One skilled in the art will recognize that avoiding direct contact between second gate dielectric layer 23 and a photoresist material reduces metal and sodium contamination in the dielectric layer. Since second gate dielectric layer 23 will form the gate dielectric for thin-film transistor under construction, keeping the dielectric layer free from contamination is important. In addition, the protection of second gate dielectric layer 23 from the high voltage environment of a plasma etch reactor improves the dielectric integrity of the material. By reducing the potential build-up on the dielectric layer during plasma etching, premature low-voltage breakdown of the dielectric layer is minimized.

Figure 3:
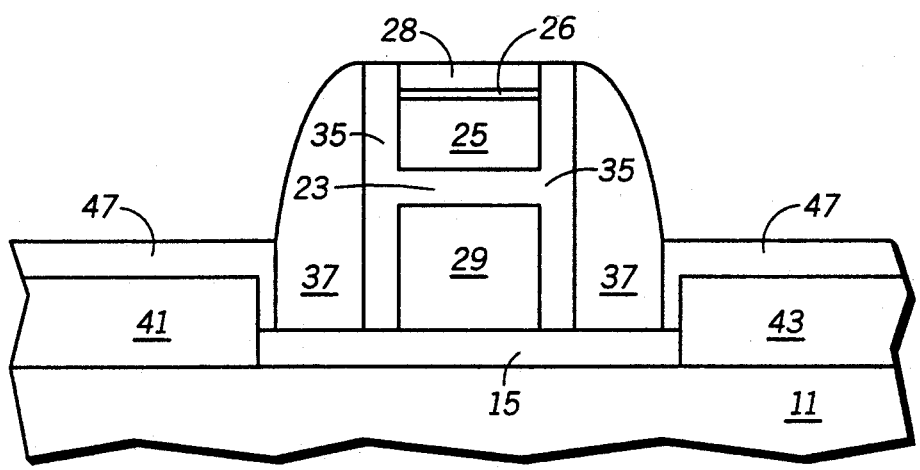

Once shared-gate electrode 29 is defined, a temporary sidewall spacer 37 is formed on shared-gate electrode 29 and first dielectric layer 15 is etched, as shown in FIG. 3. Preferably, a sidewall spacer forming material such as silicon nitride is deposited and anisotropically etched to form temporary sidewall spacer 37. Spacer 37 acts as an etch mask during the etching of dielectric layer 15. The etching of dielectric layer 15 exposes a portion of the surface of substrate 11 which is aligned to temporary sidewall spacer gate 37.

After etching to expose a portion of the surface of substrate 11, an epitaxial silicon layer is grown on substrate 11 using the exposed portion as a nucleation site for the epitaxial growth. As illustrated in FIG. 3, the epitaxial silicon, having been seeded by the exposed silicon in substrate 11, is self-aligned to temporary sidewall spacer 37 overlying gate electrode 29. The conductivity of the epitaxial layer is adjusted by ion implantation of a n-type dopant such as Phosphorus or Arsenic into the epitaxial layer. In an alternative method, the epitaxial layer can be doped during epitaxial growth. Preferably, the epitaxial layer is oxidized to form a thin oxide layer on the surface and then doped by implantation of arsenic with a dose of about 2.5 to $8.0 \times 10^{15}$ ions per square centimeter. The epitaxial growth and doping process results in the formation of elevated source and drain regions 41 and 43 overlying the surface of substrate 11.

Following epitaxial growth, elevated source and drain regions 41 and 43 are oxidized to form an insulating layer 47. Insulating layer 47 overlies upper surface and extends along the sides of elevated source and drain regions 41 and 43 between the epitaxial layer and temporary sidewall spacer 37.

Figure 4:
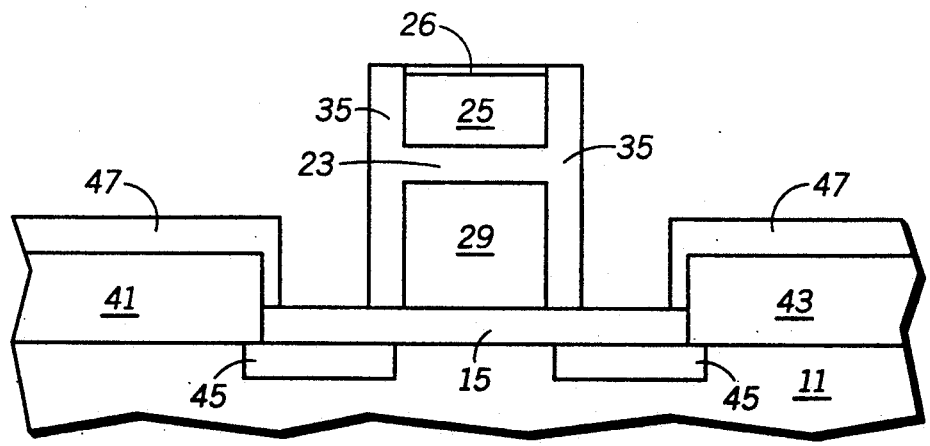

After oxidation, temporary sidewall spacers 37 and oxidation barrier 28 are removed exposing protective layer 26 and a portion of the surface of substrate 11 adjacent to shared-gate electrode 29. Preferably, a wet etch process is used to remove temporary sidewall spacers 37 and layers 28. After temporary sidewall spacer 37 is removed, a portion of the surface of substrate 11 intermediate to shared-gate electrode 29 and source and drain regions 41 and 43 is exposed, as shown in FIG. 4. Next, lightly doped regions 45 are formed in substrate 11 by ion implantation using shared-gate electrode 29 as an implant mask. The formation of lightly doped regions 45 in substrate 11 electrically couples the channel region below shared-gate 29 with elevated source and drain regions 41 and 43. Preferably, phosphorus is implanted with a dose of about $5.0 \times 10^{12}$ to $5.0 \times 10^{15}$ ions per square centimeter. Alternatively, arsenic or antimony can be implanted to form lightly doped regions 45.

The functional elements of MOS bulk transistor 20 are now complete. Referring to FIG. 4, MOS transistor 20 includes shared-gate electrode 29 and elevated source and drain regions 41 and 43 electrically coupled to shared-gate electrode 29 by lightly doped regions 45. In addition, lightly doped regions 45 define a channel region in substrate 11 immediately below shared-gate electrode 29.

Figure 5:
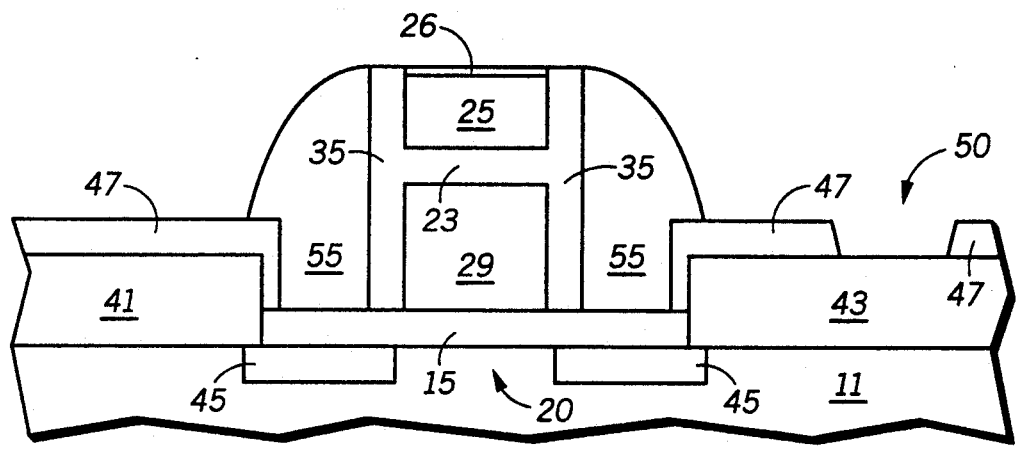

Continuing with the fabrication sequence, permanent sidewall spacers 55 are formed on gate electrode 29, as illustrated in FIG. 5. Permanent sidewall spacers 55 are formed by first depositing an insulating material onto substrate 11 filling the spaces between the shared-gate electrode 29 and elevated source and drain regions 41 and 43, then, anisotropically etching the material to form the spacers. Preferably the insulating material is a material which is differentially etchable with respect to the remaining portions of diffusion barrier layer 28 and insulating layer 47. For example, if protective layer 26 and insulation layer 47 are silicon oxide, permanent sidewall spacers 55 can be formed by deposition and anisotropic etching of silicon nitride.

Once permanent sidewall spacers 55 are formed, a photolithographic pattern is defined and a contact opening 50 is etched in a portion of insulation layer 47 overlying drain region 43. Contact opening 50 will provide a connection point between elevated drain region 43 and the drain region of the thin-film transistor which is to be formed over MOS transistor 20. Preferably a fluorocarbon plasma etching process is used to etch contact opening 50. Alternatively, a combination of a wet etching process followed by a plasma etching process can be used. After etching the photolithographic pattern is removed.

The formation of MOS transistor 20 having the features illustrated in FIG. 5 offers several advantages. For example, the use of elevated source and drain regions formed by selective epitaxial silicon growth offers a small transistor geometry while providing ample space for electrical contact by overlying components. Further advantages are realized by the substantially planar surface remaining after formation of the first transistor level is complete. By eliminating the requirement for overlying conductive structures to make physical contact to the substrate surface, well known problems associated with step coverage are minimized. Considerable variation in surface topography can lead to void formation in conductive leads when the leads traverse areas of extremely uneven surface topography. The particular construction technique utilized to fabricate MOS transistor 20 reduces the severity of the step coverage problem by providing a structure having low topographic contrast.

Figure 6:
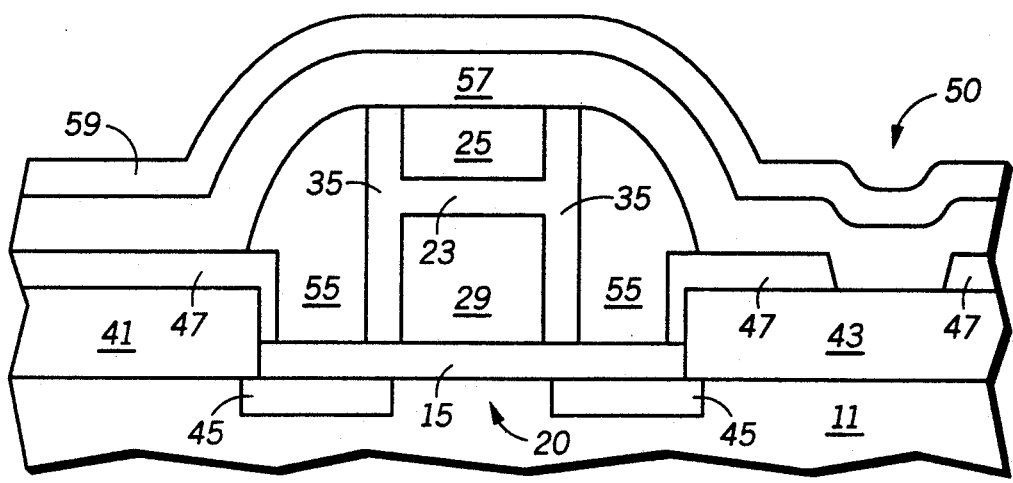

The fabrication of an overlying thin-film transistor 22 begins with the deposition of a second conductive layer 57, as shown in FIG. 6. First, protective layer 26 overlying channel interface layer 25 is etched away using a blanket wet etch process. The etch exposes the surface of channel interface layer 25 and removes any silicon oxide overlying the surface of elevated drain region 43 exposed by contact opening 50. Next, second conductive layer 57 is deposited to overlie channel interface layer 25 and elevated source and drain regions 41 and 43. Insulation layer 47 electrically isolates elevated source region 41 from second conductive layer 57 while a metallurgical contact is formed between second conductive layer 57 and elevated drain region 43 at contact opening 50. Second conductive layer 57 is preferably formed by chemical vapor deposition of a SiGe layer. Alternatively, second conductive layer 57 can be polysilicon. Preferably, second conductive layer is deposited to a thickness of about 10 to 100 nanometers and most preferably about 25 nanometers. Second conductive layer 57 will form the conductive channel for thin-film and source and drain regions for thin-film transistor 22.

Figure 7:
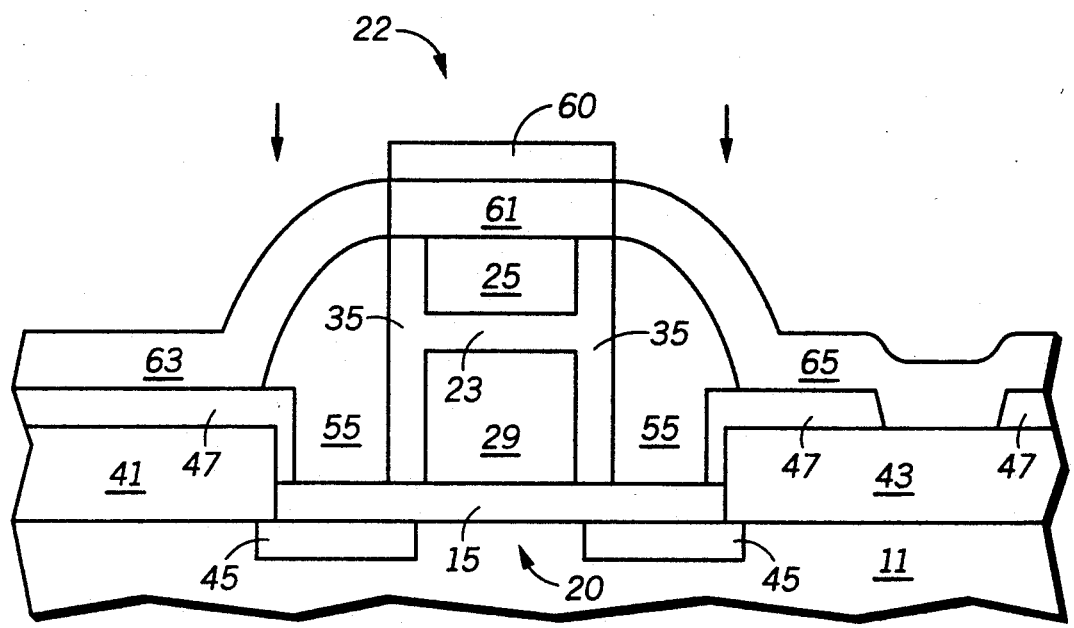

After the deposition of second conductive layer 57, a diffusion barrier layer 59 is formed overlying second conductive layer 57 and the SiGe is annealed to form a crystalline phase. Preferably, diffusion barrier layer 59 is silicon nitride deposited to a thickness of about 25 to 150 nanometers. Alternatively, second diffusion barrier layer can be an oxynitride. After annealing, diffusion barrier layer 59 is photolithographically patterned and etched to form a cap 60 overlying shared-gate electrode 29. As illustrated in FIG. 7, Cap 60 is aligned to shared-gate electrode 29 and overlies a channel portion 61 of second conductive layer 57. Once cap 60 is formed, a conductivity determining dopant is ion implanted into second conductive layer 57 using cap 60 as an implantation mask. The implantation forms a conductive region aligned to cap 60 defining the source and drain regions of thin-film transistor 22.

In one embodiment, the conductivity determining dopant is boron ion implanted to dose of about $1.0 \times 10^{14}$ to $5.0 \times 10^{15}$ ions per square centimeter. The use of SiGe to form second conductive layer 57 has the particular advantage that, when doped with boron, the boron atoms can be activated at a much lower annealing temperature than in polysilicon. For example, boron will activate at about 500° C. in SiGe, while the same extent of activation in polysilicon requires an annealing temperature of about 900° C.

In the case where channel interface layer 25 is polysilicon and second conductive layer 57 is SiGe, diffusion of Ge to second gate dielectric layer 23 during annealing is avoided. The presence of Ge at the interface between second gate dielectric layer 23 and channel interface layer 25 is undesirable because excess Ge near the interface can cause flat band voltage instability in the thin-film transistor.

In an alternative embodiment, after the boron implant, a refractory metal is deposited to overlie second conductive layer 57 and the structure is annealed to form a refractory metal silicide. Preferably, the refractory metal is titanium deposited to a thickness of about 20 to 80 nanometers. However, other refractory metals can be used that will form a silicide material differentially etchable with respect to insulating layer 47. Alternatively, refractory metals such cobalt, tungsten, tantalum, and the like can also be used. During the annealing process, cap 60 prevents the formation of a refractory metal silicide in channel portion 61 and thereby functions to self-align the silicided portions of second conductive layer 57 to channel portion 61. The formation of a refractory silicide creates a metal-silicon interface between the source and drain regions and the channel region of the thin-film transistor. The silicide forming process can be continued until virtually all of second conductive layer 57 is converted to a silicide material. The complete conversion of layer 57 to a silicide material has the advantage of reducing the contact resistance between the conductive layers in contact opening 50.

After the conductivity of second conductive layer 57 set, either by ion implantation or by implantation and silicide formation, the layer is photolithographically patterned and etched to form thin-film source and drain regions 65 and 63, as shown in FIG. 7. With the formation of source and drain regions 63 and 65, thin-film transistor 22 is complete. Thin-film transistor 22 includes a conductive channel, channel portion 61, overlying and aligned to shared-gate electrode 29, and silicide source and drain region 63 and 65 which are also aligned to shared-gate electrode 29.

The process of selective silicide formation provides thin-film transistor 22 with source and drain regions having different conductivity characteristics than the channel region. The formation of thin-film transistor 22, using the foregoing inventive combination of materials and processes, provides a thin-film transistor having desired electrical characteristics while maintaining a minimal vertical thickness.

For example, the conductive regions of thin-film transistor 22 provide sufficient resistance to pull the voltage level up following a read-write operation and to avoid current leakage from the cell. This function is accomplished through the particular combination of current resistivities of the silicide source and drain regions and the SiGe channel region. The use of both a refractory metal silicide and SiGe permits the conductive region of thin-film transistor 22 to be constructed from materials having a layer thickness far less than thin-film transistors using a conventional combination of materials.

Thus it is apparent that there has been provided, in accordance with the invention, a semiconductor device and process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the conductivity of the doping processes can be reversed wherein the thin-film transistor is an N-channel device and the underlying MOS transistor is a P-channel device. In addition, both the thin-film transistor and the underlying MOS transistor can be the same conductivity type. It is therefore intended to include within the invention all such variations and modifications as fall within the scope of the appended claims and equivalents thereof.

We claim:

1. A semiconductor device comprising:
    a substrate having a principal surface;
    a gate electrode overlying the principal surface, the gate electrode having a upper surface opposite the principal surface;
    a gate dielectric layer overlying the gate electrode;
    an electrically conductive channel interface layer overlying and coextensive with the upper surface of the gate electrode and spaced apart from the gate electrode by the gate dielectric layer, wherein the conductive channel interface layer is differentially etchable with respect to the gate dielectric layer; and
    a conductive thin-film layer overlying the gate electrode wherein a channel portion of the thin-film layer forms a metallurgical contact to the channel interface layer and remaining portions of the thin-film layer extend outward therefrom.

2. The semiconductor device of claim 1 further comprising:
    an insulating layer overlying the principal surface and separating the remaining portions of the thin-film layer from the principal surface;
    an insulating sidewall spacer overlying vertical surfaces of the gate electrode; and
    a diffusion barrier layer overlying the channel portion of the conductive thin-film layer and coextensive with the gate electrode.

3. A semiconductor device comprising:
    a substrate having a principal surface;
    a first dielectric layer overlying the principal surface;
    a shared-gate electrode overlying the first dielectric layer;
    a second dielectric layer overlying the shared-gate electrode;
    an electrically conductive channel interface layer overlying the second dielectric layer and coextensive with the shared-gate electrode, wherein the conductive channel interface layer is differentially etchable with respect to the second dielectric layer;
    elevated source and drain regions of a first conductivity type overlying the principal surface and spaced apart by the shared-gate electrode;
    a thin-film channel region overlying and in contact with the channel interface layer; and
    thin-film source and drain regions of a second conductivity type overlying and electrically isolated from the shared-gate electrode and the elevated source and drain regions, and spaced apart by the thin-film channel region.

4. The semiconductor device of claim 3 wherein the channel interface layer comprises polysilicon having a thickness of about 25 to 50 nanometers.

5. The semiconductor device of claim 3 wherein the channel interface layer comprised silicon-germanuim having a thickness of about 25 to 50 nanometers.

6. The semiconductor device of claim 3 further comprising an oxide encapsulation layer overlying the sidewalls of the shared-gate electrode and the channel interface layer.

7. A method for making a semiconductor device comprising:
    providing a substrate having a principal surface;

forming a gate electrode overlying the principal surface, the gate electrode having a upper surface opposite the principal surface;

forming a gate dielectric layer overlying the gate electrode;

forming an electrically conductive channel interface layer overlying and coextensive with the upper surface of the gate electrode and spaced apart from the gate electrode by the gate dielectric layer, wherein the channel interface layer is differentially etchable with respect to the gate dielectric layer; and forming a conductive thin-film layer overlying the gate electrode wherein a channel portion of the thin-film layer forms a metallurgical contact to the channel interface layer and remaining portions of the thin-film layer overlie the principal surface.

8. The method of claim 7 wherein the step of forming a conductive channel interface layer comprises depositing and etching a layer of polysilicon.

9. The method of claim 7 wherein the step of forming a conductive channel interface layer comprises depositing and etching a layer of SiGe alloy layer.

10. The method of claim 7 wherein the step of forming a conductive thin-film layer comprises:
depositing a layer of polysilicon;
forming a silicon nitride cap on the polysilicon layer overlying the channel portion; and
introducing a conductivity determining dopant into the polysilicon layer using the nitride cap as an dopant mask.

11. The method of claim 7 wherein the step of forming a conductive thin-film layer comprises:
depositing a layer of SiGe;
forming a silicon nitride cap on the polysilicon layer overlying the channel portion; and
introducing a conductivity determining dopant into the SiGe layer using the nitride cap as an dopant mask.

12. A process for making a semiconductor device comprising:
providing a semiconductor substrate having a principal surface;
forming a first dielectric layer overlying the principal surface;
forming a shared-gate electrode overlying the first dielectric layer;
forming a second dielectric layer overlying the shared-gate electrode;
forming an electrically conductive channel interface layer overlying the second dielectric layer and coextensive with the shared-gate electrode, wherein the channel interface layer is differentially etchable with respect to the second dielectric layer;
forming elevated source and drain regions of a first conductivity type overlying the principal surface and spaced apart by a shared-gate electrode;
forming an insulating layer overlying the elevated source and drain regions;

forming thin-film source and drain regions of a second conductivity type overlying the insulating layer; and forming a thin-film channel region overlying the shared-gate electrode wherein a metallurgical contact is formed between the thin-film channel region and the channel interface layer.

13. The method of claim 12 wherein the step of forming a conductive channel interface layer comprises depositing and etching layer of polysilicon.

14. The method of claim 12 wherein the step of forming a conductive channel interface layer comprises depositing and etching a layer of SiGe alloy layer.

15. A process for making a semiconductor device comprising:
providing a semiconductor substrate having a principal surface;
forming a first dielectric layer overlying the principal surface;
depositing a first conductive layer to overlie the first dielectric layer;
oxidizing the first conductive layer to form a second dielectric layer overlying the first conductive layer;
depositing an electrically conductive channel interface layer overlying the second dielectric layer, wherein the channel interface layer is differentially etchable with respect to the second dielectric layer;
oxidizing the channel interface layer to form a third dielectric layer overlying the channel interface layer;
depositing a oxidation barrier layer to overlie the third dielectric layer;
forming a photolithographic pattern overlying the oxidation barrier layer;
sequentially etching the oxidation barrier layer, the third dielectric layer, the channel interface layer, the second dielectric layer, and the first conductive layer to form a shared-gate electrode overlying the first dielectric layer; and
oxidizing the shared-gate electrode to form an oxide encapsulation layer overlying shared-gate electrode.

16. A process of claim 15 further comprising:
removing the oxidation barrier layer and the third dielectric layer;
depositing a second conductive layer to overlie the shared-gate electrode wherein a metallurgical contact is formed between the thin-film layer and the channel interface layer;
forming a diffusion barrier cap overlying second conductive layer and coextensive with the shared-gate electrode; and
introducing a conductivity determining dopant using the diffusion barrier cap as a dopant mask to form thin-film source and drain regions.

17. The process of claim 16 further comprising:
depositing a refractory metal silicide to overlie the source drain regions and the diffusion barrier cap; and
annealing to form a refractory metal silicide in the source and drain regions.

* * * * *